(12) United States Patent
Lee et al.

(10) Patent No.: US 8,017,949 B2
(45) Date of Patent: Sep. 13, 2011

(54) TFT SUBSTRATE AND METHOD OF FABRICATING THE SAME

(75) Inventors: Eun-Guk Lee, Seoul (KR); Jang-Soo Kim, Yongin-si (KR); Hyang-Shik Kong, Sungnam-si (KR); Sang-Soo Kim, Seoul (KR); Shi-Yul Kim, Yongin-si (KR); Yoon-Ho Kang, Seoul (KR); Hoon Kang, Suwon-si (KR); Byung-Duk Yang, Yongin-si (KR); Kyoung-Tai Han, Suwon-si (KR); Dong-Yoon Kim, Seoul (KR)

(73) Assignee: Samsung Electronics Co., Ltd., Suwon-Si, Gyeonggi-Go (KR)

( * ) Notice: Subject to any disclaimer, the term of this patent is extended or adjusted under 35 U.S.C. 154(b) by 60 days.

(21) Appl. No.: 12/468,419

(22) Filed: May 19, 2009

(65) Prior Publication Data

US 2010/0065848 A1 Mar. 18, 2010

(30) Foreign Application Priority Data

Sep. 12, 2008 (KR) .................. 10-2008-0090448

(51) Int. Cl.
*H01L 29/06* (2006.01)
(52) U.S. Cl. ............ 257/59; 257/E33.053; 257/E21.414; 438/29
(58) Field of Classification Search .................... 257/59, 257/E33.053, E21.414; 438/29
See application file for complete search history.

(56) References Cited

U.S. PATENT DOCUMENTS

2005/0151898 A1* 7/2005 Yi et al. .................. 349/106
2006/0132038 A1* 6/2006 Kweon .................. 313/582

FOREIGN PATENT DOCUMENTS

| JP | 2002-131735 | 5/2002 |
| JP | 2002-350887 | 12/2002 |
| KR | 1020050031592 | 4/2005 |

OTHER PUBLICATIONS

English Abstract for Publication No. JP2002131735, May 9, 2002.
English Abstract for Publication No. JP2002350887, Dec. 4, 2002.
English Abstract for Publication No. 1020050031592, Apr. 6, 2005.

* cited by examiner

*Primary Examiner* — Jami M Valentine
(74) *Attorney, Agent, or Firm* — F. Chau & Associates, LLC

(57) ABSTRACT

Provided are a thin-film transistor (TFT) substrate which can facilitate the formation of contact holes and has improved reliability and a method of fabricating the TFT substrate. The TFT substrate includes a gate wiring formed on an insulating substrate; a data wiring defining a pixel region by intersecting the gate wiring, the data wiring including a source electrode and a drain electrode; a plurality of black matrix barrier ribs formed along the boundaries of the pixel region; a color filter formed to cover the pixel region; a pixel electrode formed on the color filter; and a plurality of contact holes formed through the color filter near the corners of the pixel region through which the pixel electrode and the drain electrode contact each other.

12 Claims, 9 Drawing Sheets

TFT SUBSTRATE AND METHOD OF FABRICATING THE SAME

CROSS-REFERENCE TO RELATED APPLICATION

This application claims priority from Korean Patent Application No. 10-2008-0090448 filed on Sep. 12, 2008 in the Korean Intellectual Property Office, the contents of which are herein incorporated by reference in their entirety.

BACKGROUND OF THE INVENTION

1. Field of the Invention

The present disclosure is directed to a thin-film transistor (TFT) substrate and a method of fabricating the same, and more particularly, to a TFT substrate which can facilitate the formation of contact holes and has improved reliability and a method of fabricating the TFT substrate.

2. Discussion of the Related Art

Liquid crystal displays (LCDs), which are one of the most widely-used type of flat panel displays (FPDs), include two substrates having a plurality of electrodes formed thereon and a liquid crystal layer interposed between the two substrates, and adjust the amount of light transmitted through the liquid crystal layer by applying a voltage to the electrodes to rearrange the liquid crystal molecules in the liquid crystal layer.

A thin-film transistor (TFT) substrate, which is one of two substrates that form an LCD, may include a plurality of TFTs and a plurality of pixel electrodes. Research efforts to improve the planarization and optical properties of LCDs and to address misalignment issues have focused on the color-on-array (COA) structure in which color filters are formed on a TFT substrate, and in particular, on methods by which color filters are formed using an inkjet printing method, and by which pixel electrodes are connected to drain electrodes by forming contact holes through the color filters.

However, if color filters are too thick, contact holes may not be properly formed through the color filters.

To address this issue, color filters may not be formed in areas in which contact holes are to be formed. In this case, however, light leakage may occur near contact holes, and thus, the reliability of TFT substrates may deteriorate.

SUMMARY OF THE INVENTION

Aspects of the present invention provide a thin-film transistor (TFT) substrate which can facilitate the formation of contact holes and has improved reliability.

Aspects of the present invention also provide a method of fabricating a TFT substrate which can facilitate the formation of contact holes and has improved reliability.

According to an aspect of the present invention, there is provided a TFT substrate including: a gate wiring formed on an insulating substrate; a data wiring defining a pixel region by intersecting the gate wiring, the data wiring including a source electrode and a drain electrode; a plurality of black matrix barrier ribs formed along the boundaries of the pixel region; a color filter formed to cover the pixel region; a pixel electrode formed on the color filter; and a plurality of contact holes formed through the color filter near the corners of the pixel region through which the pixel electrode and the drain electrode contact each other.

According to another aspect of the present invention, there is provided a method of fabricating a TFT substrate, the method including: forming a gate wiring on an insulating substrate; forming a data wiring, which defines a pixel region by intersecting the gate wiring and includes a source electrode and a drain electrode; forming a plurality of black matrix barrier ribs the boundaries of the pixel region; forming a color filter to cover the pixel region; forming a plurality of contact holes through the color filter near the corners of the pixel region; and forming a pixel electrode on the color filter, the pixel electrode contacting the drain electrode through the contact holes.

DETAILED DESCRIPTION OF EXEMPLARY EMBODIMENTS

Embodiments of the present invention will now be described more fully with reference to the accompanying drawings, in which exemplary embodiments of the invention are shown. The invention may, however, be embodied in many different forms and should not be construed as being limited to the embodiments set forth herein.

It will be understood that when an element is referred to as being "connected" or "coupled" to another element, it can be directly connected or coupled to the other element or intervening elements may be present. Like numbers refer to like elements throughout.

Embodiments of the present invention will hereinafter be described in detail, taking as an example a thin-film transistor (TFT) substrate including a plurality of patterned pixel electrodes which can each be divided into two sub-pixel electrodes. However, embodiments of the present invention can also be applied to a patterned vertical alignment (PVA) structure in which a pixel region includes a plurality of domain-dividing elements, a TFT substrate having a plurality of non-patterned pixel electrodes, and a TFT substrate having a plurality of pixel electrodes, each of which is not divided into sub-pixel electrodes.

A TFT substrate according to an exemplary embodiment of the present invention will hereinafter be described in detail with reference to FIGS. 1 and 2.

Figure 1:
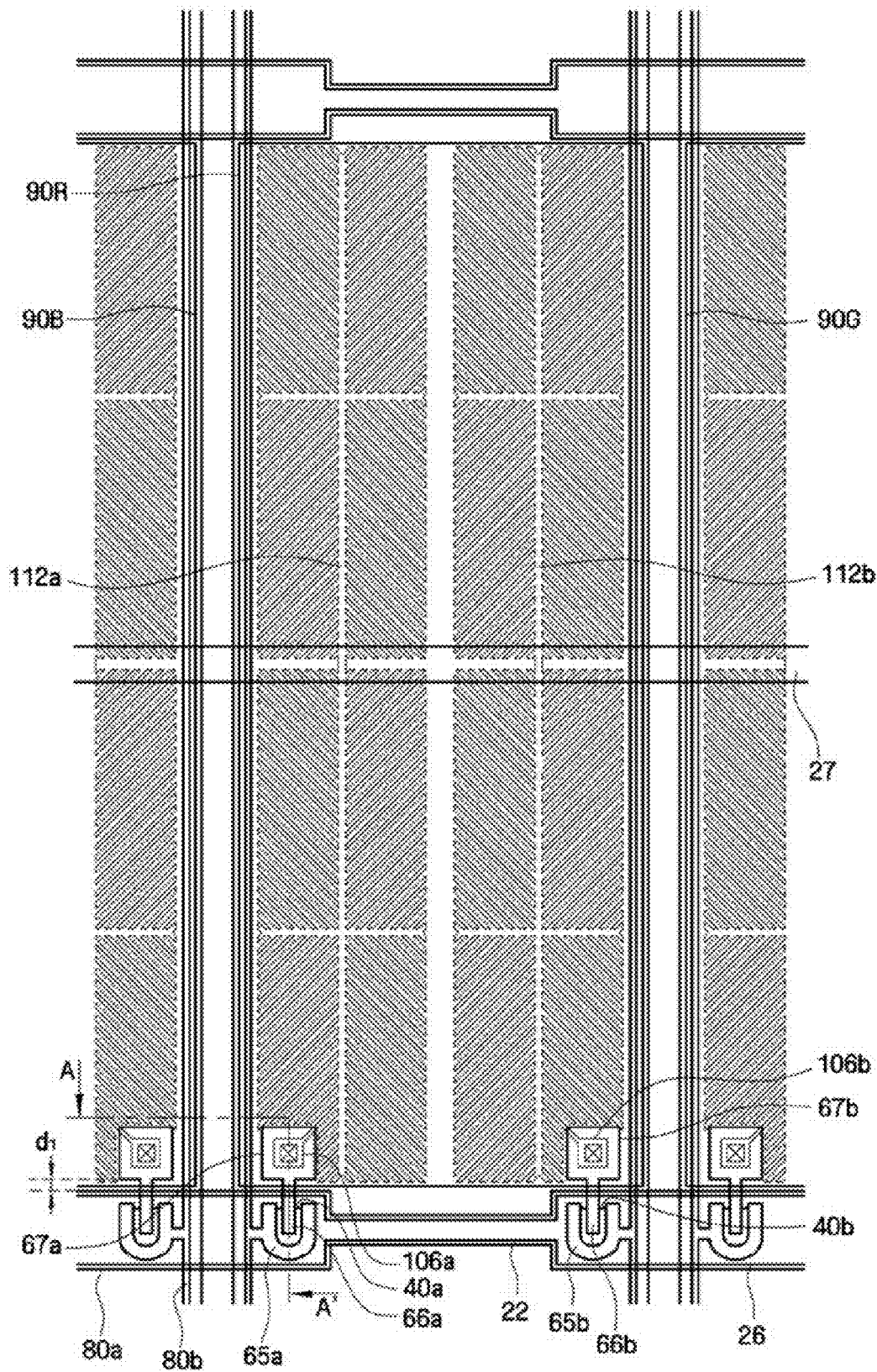
FIG. 1 illustrates a layout of a thin-film transistor (TFT) substrate according to an exemplary embodiment of the present invention.
Figure 2:
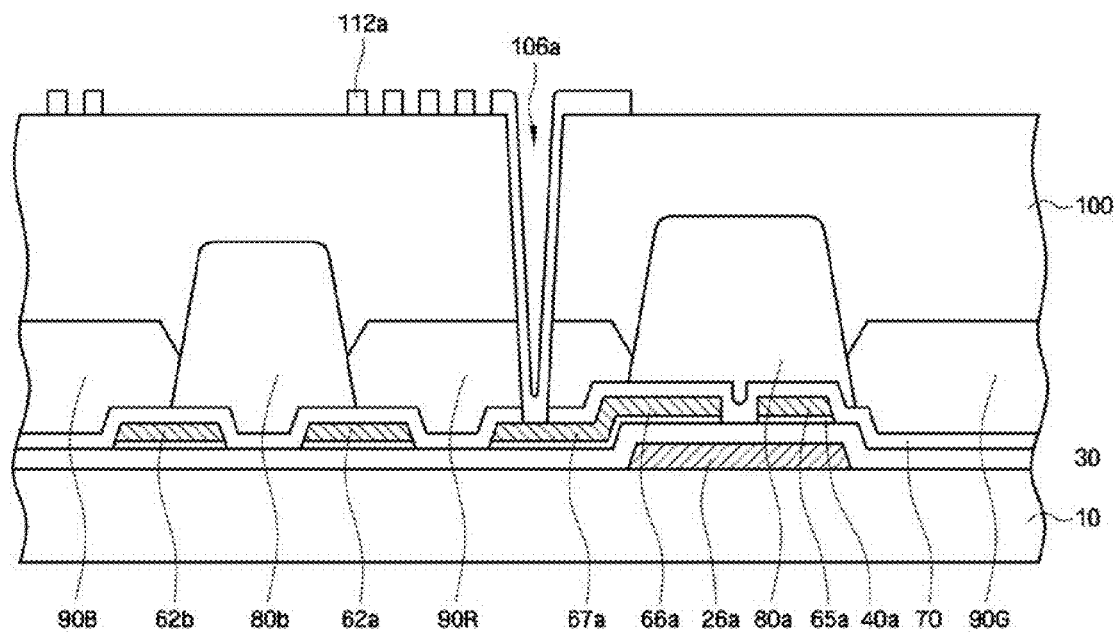
FIG. 2 illustrates a cross-sectional view taken along line A-A' of FIG. 1.

FIG. 1 illustrates a layout of a TFT substrate according to an exemplary embodiment of the present invention, and FIG. 2 illustrates a cross-sectional view taken along line A-A' of FIG. 1. Referring to FIGS. 1 and 2, the TFT may include an insulating substrate 10 formed of soda lime glass, glass such as borosilicate glass, or a plastic material, and various elements such as TFTs formed on the insulating substrate 10.

A gate wiring (22 and 26) may be formed on the insulating substrate 10, and may transmit a gate signal. The gate wiring (22 and 26) may include a gate line 22 extending in, for example, a row direction, and a gate electrode 26 of a TFT protruding from the gate line 22. One gate line 22 may be formed in each pixel region. However, embodiments of the present invention are not thus restricted. That is, two gate lines 22 may be formed in each pixel region, and may transmit a gate signal to different sub-pixels. In this case, two gate electrodes 26 may be formed in each pixel region and may be disposed near two data lines 62 on either side of a pixel.

A pixel region may be defined as a closed region by a pair of adjacent gate lines 22 and a pair of adjacent data lines 62 intersecting the pair of adjacent gate lines 22.

A storage line 27 may be formed on the insulating substrate 10 and may transmit a common voltage. The storage line 27 may extend in the row direction substantially in parallel with the gate line 22.

The gate wiring (22 and 26) and the storage line 27 may be formed of an aluminum (Al)-based metal such as aluminum and an aluminum alloy, a silver (Ag)-based metal such as silver and a silver alloy, a copper (Cu)-based metal such as copper and a copper alloy, a molybdenum (Mo)-based metal such as molybdenum and a molybdenum alloy, chromium (Cr), titanium (Ti) or tantalum (Ta). The gate wiring (22 and 26) and the storage line 27 may have a multilayer structure including two conductive layers (not shown) having different physical properties: a first conductive layer formed of a low-resistive metal such as an aluminum-based metal, a silver-based metal or a copper-based metal to reduce signal delays or voltage drops and a second conductive layer formed of a material, such as a molybdenum-based metal, chromium, titanium or tantalum, having excellent contact properties with respect to, for example, zinc oxide (ZnO), indium tin oxide (ITO) or indium zinc oxide (IZO). For example, the gate wiring (22 and 26) and the storage line 27 may have a double-layer structure including a lower chromium layer and an upper aluminum layer or a double-layer structure including a lower aluminum layer and an upper molybdenum layer. However, embodiments of the present invention are not thus restricted. That is, the gate wiring (22 and 26) and the storage line 27 may be formed of various metals or various conductive materials other than those set forth herein.

A gate insulating layer 30 may be formed of silicon oxide (SiOx) or silicon nitride (SiNx) on the insulating substrate 10, the gate wiring (22 and 26) and the storage line 27.

A pair of active layer patterns 40a and 40b may be formed of hydrogenated amorphous silicon or polycrystalline silicon on the gate insulating layer 30. The active layer patterns 40a and 40b may be formed in various shapes such as an island shape or a linear shape. For example, in this exemplary embodiment, the active layer patterns 40a and 40b may be formed as lines.

An ohmic contact layer (not shown) may be formed of silicide or n+ hydrogenated amorphous silicon doped with a high concentration of n-type impurities on the active layer patterns 40a and 40b. More specifically, a pair of ohmic contact layers (not shown) may be formed on the active layer patterns 40a and 40b, respectively.

Data wiring (62a, 62b, 65a, 65b, 66a, 66b, 67a and 67b) may be formed on the ohmic contact layers and the gate insulating layer 30.

The data wiring (62a, 62b, 65a, 65b, 66a, 66b, 67a and 67b) may include first and second data lines 62a and 62b, first and second source electrodes 65a and 65b connected to the first and second data lines 62a and 62b, respectively, first and second drain electrodes 66a and 66b separated from and facing the first and second source electrodes 65a and 65b, respectively, and first and second drain electrode extensions 67a and 67b.

The first and second data lines 62a and 62b may extend in, for example, a column direction, may intersect the gate line 22 and the storage line 27 and may transmit a data voltage. The first and second data lines 62a and 62b may intersect the gate line 22, thereby defining a pixel region.

The first and second source electrodes 65a and 65b may be formed at the first and second data lines 62a and 62b, respectively, and may extend toward the first and second drain electrodes 66a and 66b, respectively. A data line terminal (not shown) may be formed at the end of each of the first and second data lines 62a and 62b. The data line terminals may receive a data signal from another layer or an external source and may transmit the received data signal to the first and second data lines 62a and 62b. The first data line 62a may transmit a data signal to a first sub-pixel electrode 112a, and the second data line 62b may transmit a data signal to a second sub-pixel electrode 112b.

The data wiring (62a, 62b, 65a, 65b, 66a, 66b, 67a and 67b) may be formed of a fire-resistant metal such as chromium, a molybdenum-based metal, tantalum or titanium. The data wiring (62a, 62b, 65a, 65b, 66a, 66b, 67a and 67b) may have a multilayer structure including a lower layer (not shown) formed of a fire-resistant metal and an upper layer formed of a low-resistive material. For example, the data wiring (62a, 62b, 65a, 65b, 66a, 66b, 67a and 67b) may have a double-layer structure including a lower chromium layer and an upper aluminum layer, a double-layer structure including a lower aluminum layer and an upper molybdenum layer, or a triple-layer structure including a lower molybdenum layer, an intermediate aluminum layer and an upper molybdenum layer.

The first and second source electrodes 65a and 65b may at least partially overlap the active layer patterns 40a and 40b, respectively. The first source electrode 65a and the first drain electrode 66a may be disposed on the opposite sides of a gate electrode 26a, and the second source electrode 65b and the second drain electrode 66b may be disposed on the opposite sides of a gate electrode 26b. The first and second drain electrodes 66a and 66b may at least partially overlap the active layer patterns 40a and 40b, respectively. The ohmic contact layers may be disposed between the active layer patterns 40a and 40b and the first and second source electrodes 65a and 65b and between the active layer patterns 40a and 40b and the first and second data lines 62a and 62b. The ohmic contact layers may reduce the contact resistance between the active layer patterns 40a and 40b and the first and second source electrodes 65a and 65b and between the active layer patterns 40a and 40b and the first and second data lines 62a and 62.

A passivation layer 70 may be formed on the first and second data lines 62a and 62b, the first and second drain electrodes 66a and 66b, and exposed portions of the active layer patterns 40a and 40b. The passivation layer 70 may be formed of an inorganic material such as silicon nitride or silicon oxide. The passivation layer 70 may protect the exposed portions of the active layer patterns 40a and 40b.

In this exemplary embodiment, a pair of data lines may be formed in each pixel region. However, embodiments of the present invention are not thus restricted. That is, embodiments of the present invention can also be applied to a TFT substrate in which only one data line is formed in each pixel region.

A plurality of black matrix barrier ribs 80a and 80b may be formed on the gate wiring (22 and 26) and the first and second data lines 62a and 62b. The black matrix barrier ribs 80a and 80b may prevent light leakage along the boundaries of a pixel region and may thus improve picture quality. To maximize an aperture ratio, the black matrix barrier ribs 80a and 80b may extend between the first and second data lines 62a and 62b and may partially overlap the first and second data lines 62a and 62b to not reduce the area of a pixel region. The black matrix barrier ribs 80a and 80b may include a gate black matrix barrier rib 80a formed on the gate wiring (22 and 26) and a data black matrix barrier rib 80b formed on the first and second data lines 62a and 62b and intersecting the gate black matrix barrier rib 80a.

The black matrix barrier ribs 80a and 80b may be formed of a metal such as chromium (Cr), a metal oxide such as chromium oxide, or organic black resist. The black matrix barrier ribs 80a and 80b may also contain fluorine (F) to have a reduced affinity for a plurality of color filters 90R, 90G and 90B. In this case, the black matrix barrier ribs 80a and 80b may have a low affinity for the color filters 90R, 90G and 90B, and may thus allow the color filters 90R, 90G and 90B to be thinner in areas near the black matrix barrier ribs 80a and 80b. The black matrix barrier ribs 80a and 80b may contain about 0.01 to about 0.09 weight % of fluorine based on the total dry solid of the black matrix barrier ribs 80a and 80b. If the black matrix barrier ribs 80a and 80b contain less than about 0.01 weight % of fluorine, the color filters 90R, 90G and 90B may be too thick, interfering with the formation of contact holes. On the other hand, if the black matrix barrier ribs 80a and 80b contain more than about 0.09 weight % of fluorine based on the total dry solid of the black matrix barrier ribs 80a and 80b, the color filter 90R, 90G or 90B may not be able to fully cover a pixel region, and thus, light leakage may occur. The color filter 90R, 90G or 90B may at least partially overlap the black matrix barrier ribs 80a and 80b, and may cover a whole pixel region. Therefore, it is possible to prevent light leakage that may occur when the color filter 90R, 90G or 90B fail to cover a whole pixel region.

The color filter 90R, 90G or 90B representing red, green or blue may be formed in the pixel region covered by the black matrix barrier ribs 80a and 80b. The black matrix barrier ribs 80a and 80b may be formed to a sufficient height to prevent overflow of the material of the color filter 90R, 90G or 90B.

The color filter 90R, 90G or 90B may allow the transmission of light in a predetermined wavelength band. The color filter 90R, 90G or 90B may be formed in a stripe, mosaic or delta shape.

The color filter 90R, 90G or 90B may be formed of a photosensitive organic material, such as, for example, photoresist. The color filter 90R, 90G or 90B may have a uniform thickness throughout an entire pixel region or may have a step difference. The color filters 90R, 90G and 90B may be formed of a red organic material, a green organic material and a blue organic material, respectively.

The color filter 90R, 90G or 90B may be unable to uniformly spread over a pixel region. Thus, the color filter 90R, 90G or 90B may be thicker in the middle of a pixel region and may be thinner along the boundaries of a pixel region. If the black matrix barrier ribs 80a and 80b contain fluorine, the thickness of the color filter 90R, 90G or 90B may vary considerably from one portion to another portion of a pixel region.

A planarization layer 100 may be formed of a photosensitive material on the black matrix barrier ribs 80a and 80b and the color filters 90R, 90G and 90B. The planarization layer 100 may be formed of, for example, a photoresist. If the planarization layer 100 is formed of a photosensitive material, the planarization layer 100 may be used as a mask for forming contact holes.

A TFT substrate according to a variation of the exemplary embodiment of FIG. 1 will hereinafter be described in detail with reference to FIG. 3.

Figure 3:
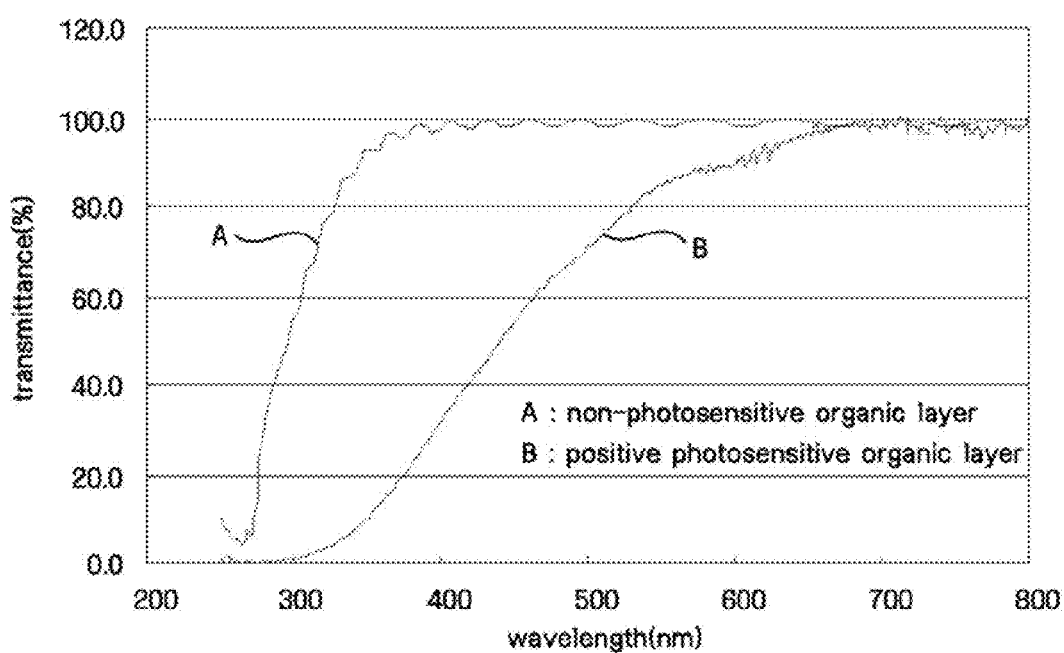
FIG. 3 illustrates a graph for comparing the transmittance of a TFT substrate according to a variation of the exemplary embodiment of FIG. 1 with the transmittance of a TFT substrate according to a first comparative example.

FIG. 3 illustrates a graph for comparing the transmittance of the TFT substrate according to the exemplary embodiment of FIG. 1 with a TFT substrate according to a variation of the exemplary embodiment. Referring to FIG. 3, the TFT substrate according to a variation of the exemplary embodiment of FIG. 1 may include a planarization layer formed of a non-photosensitive material, for example, a silicon-based material. The silicon-based material may be siloxane polymer, but embodiments of the present invention are not thus restricted. The transmittance of a TFT substrate may be improved by forming a planarization layer of a non-photosensitive material, as indicated by Table 1 below.

TABLE 1

| | Non-Photosensitive Planarization Layer | Positive Photosensitive Planarization Layer |
|---|---|---|
| Average transmittance when light having wavelength greater than 400 nm is applied | 99.01% | 82.38% |
| Average transmittance when light having wavelength of about 400 nm is applied | 97.69% | 31.86% |

Referring to Table 1, it is possible to improve the transmittance of a TFT substrate by about 83% by using a non-photosensitive planarization layer.

Referring to FIGS. 1 and 2, a plurality of contact holes 106a and 106b may be formed through the planarization layer 100 and the color filters 90R, 90G or 90B near the corners of a pixel region. More specifically, if two data lines, i.e., the first and second data lines 62a and 62b, are formed in each pixel region, two contact holes, i.e., first and second contact holes 106a and 106b, may be respectively formed at the bottom corners of a pixel region. In this case, the first contact hole 106a may serve as the contact between the first drain electrode extension 67a and the first sub-pixel electrode 112a, and the second contact hole 106b may serve as the contact between the second drain electrode extension 67b and the second sub-pixel electrode 112b.

The first and second contact holes 106a and 106b are formed through thin portions of the color filers 90R, 90G and 90B near the corners of a pixel region. Thus, it is possible to facilitate the formation of the first and second contact holes 106a and 106b. In addition, it is possible to form the first and second contact holes 106a and 106b while leaving no residues. In addition, it is possible to improve an aperture ratio compared to the case when the first and second contact holes 106a and 106b are formed in the middle of a pixel region.

A distance $d_1$ between the first and second contact holes 106a and 106b and the black matrix barrier ribs 80a and 80b may be about 3 to about 10 μm. If the distance $d_1$ is less than about 3 μm, the first and second contact holes 106a and 106b may be short-circuited with the gate wiring (22 and 26) or the data wiring (62a, 62b, 65a, 65b, 66a, 66b, 67a, and 67b). On the other hand, if the distance $d_1$ is greater than about 10 μm, the challenge of forming the first and second contact holes 106a and 106b through the color filter 90R, 90G or 90B may increase, and the formation of the first and second contact holes 106a and 106b may result in residues in the first and second contact holes 106a and 106b.

A pixel electrode (112a and 112b) may be formed on the planarization layer 100. The pixel electrode (112a and 112b) may be formed of a transparent conductive material such as ITO or IZO or a reflective conductive material such as aluminum.

The pixel electrode (112a and 112b) may be divided into the first and second sub-pixel electrodes 112a and 112b. The first sub-pixel electrode 112a may be physically and electrically connected to the first drain electrode extension 67a through the first contact hole 106a, and may thus receive a first data signal from the first drain electrode extension 67a. Likewise, the second sub-pixel electrode 112b may be physically and electrically connected to the second drain electrode extension 67b through the second contact hole 106b, and may thus receive a second data signal, which is different from the first data signal, from the second drain electrode extension 67b.

The first and second sub-pixel electrodes 112a and 112b may generate an electric field with a common electrode (not shown) on an upper substrate (not shown) in response to a data voltage applied thereto, and may thus determine the alignment of liquid crystal molecules in a liquid crystal layer between the common electrode and the first and second sub-pixel electrodes 112a and 112b. The first and second sub-pixel electrodes 112a and 112b may be driven by different data signals, thereby improving lateral visibility.

In the exemplary embodiment of FIG. 1, each the first and second sub-pixel electrodes 112a and 112b may include a plurality of domain groups. For example, each of the first and second sub-pixel electrodes 112a and 112b may include two domain groups: one domain group corresponding to the upper half of the first or second sub-pixel electrode 112a or 112b and the other domain group corresponding to the lower half of the first or second sub-pixel electrode 112a or 112b. Each of the two domain groups may include a plurality of domains, for example, four domains respectively corresponding to four quadrants of the first or second sub-pixel electrodes 112a or 112b. That is, each of the first and second sub-pixel electrodes 112a and 112b may be divided into eight domains. Each of the eight domains may include a plurality of fine electrodes that extend in a predetermined direction substantially in parallel with one another. Fine slits may be disposed among the fine electrodes. A pair of adjacent domains or domain groups may be connected to each other, and may thus form a domain group.

The fine electrodes may be formed as bars that extend in a predetermined direction. The fine electrodes and the fine slits may extend in a predetermined direction in parallel with one another. The direction in which the fine electrodes and the fine slits extend may vary from one domain to another. That is, the direction in which the fine electrodes and the fine slits extend may form an angle of 45°, 135°, 225°, or 315° with the polarization axis of a polarization plate (not shown) formed on the insulating substrate 10. Since the fine electrodes apply a tilt driving force to the liquid crystal molecules in a liquid crystal layer, it is possible to realize an LCD capable of providing a high response speed without patterning a common electrode of an upper substrate. The fine electrodes may have a greater width in areas in which the first and second contact holes 106a and 106b are formed than in areas in which the first and second contact holes 106a and 106b are not formed to properly contact the first and second drain electrode extensions 67a and 67b.

A column spacer (not shown) may be formed on a TFT substrate. The column spacer may maintain the cell gap between the TFT substrate and an upper substrate.

The fabrication of a TFT substrate according to another exemplary embodiment of the present invention will hereinafter be described in detail with reference to FIGS. 1, 2 and 4 through 10.

FIGS. 4 through 10 illustrate cross-sectional views for explaining the fabricating of a TFT substrate according to a another exemplary embodiment of the present invention. In FIGS. 1, 2 and 4 through 10, like reference numerals indicate like elements, and thus, detailed descriptions thereof will be omitted.

Figure 4:
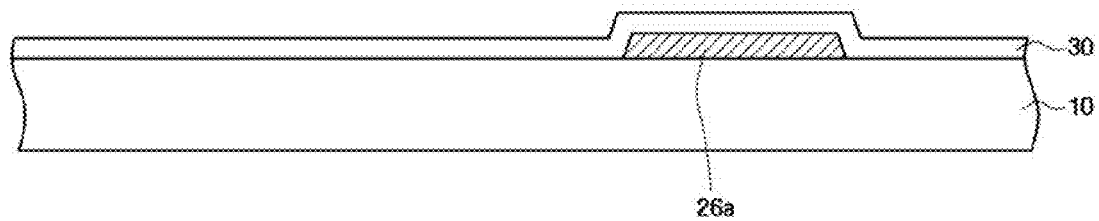
FIGS. 4 through 10 illustrate diagrams for explaining the fabrication of a TFT substrate according to an exemplary embodiment of the present invention.

Referring to FIGS. 1 and 4, a gate wiring (22 and 26) and a storage line 27 may be formed on an insulating substrate 10. The gate wiring (22 and 26) and the storage line 27 may be formed using sputtering. Wet etching or dry etching may be used to perform patterning for forming the gate wiring (22 and 26) and the storage line 27. More specifically, patterning for forming the gate wiring (22 and 26) and the storage line 27 may be performed using wet etching involving the use of an etchant such as phosphoric acid, nitric acid, or acetic acid. Alternatively, patterning for forming the gate wiring (22 and 26) and the storage line 27 may be performed using dry etching involving the use of a chlorine-based etching gas such as $Cl_2$ or $BCl_3$.

Thereafter, a gate insulating layer 30 may be formed on the insulating substrate 10, the gate wiring (22 and 26) and the storage line 27. The gate insulating layer 30 may be formed using plasma-enhanced chemical vapor deposition (PECVD) or reactive sputtering.

Figure 5:
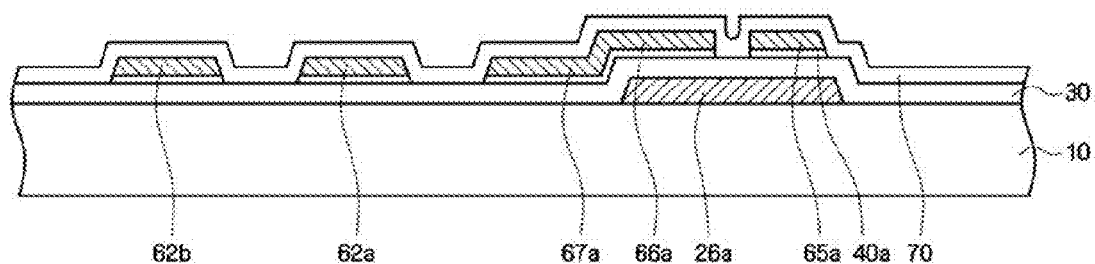

Thereafter, referring to FIGS. 1 and 5, a hydrogenated amorphous silicon layer, an n+ hydrogenated amorphous silicon layer doped with n-type impurities, and a conductive material for forming a data wiring may be sequentially deposited on the gate insulating layer 30 and may then be patterned, thereby forming data wiring (62a, 62b, 65a, 65b, 66a, 66b, 67a, and 67b), an ohmic contact layer (not shown), and a pair of active layer patterns 40a and 40b. The gate wiring (22 and 26) includes a gate line 22. The data wiring (62a, 62b, 65a, 65b, 66a, 66b, 67a, and 67b) include first and second data lines 62a and 62b. The first and second data lines 62a and 62b define a pixel region together with the gate line 22.

Thereafter, a passivation layer 70 may be deposited on the data wiring (62a, 62b, 65a, 65b, 66a, 66b, 67a, and 67b) and the gate insulating layer 30 by using PECVD.

Figure 6:
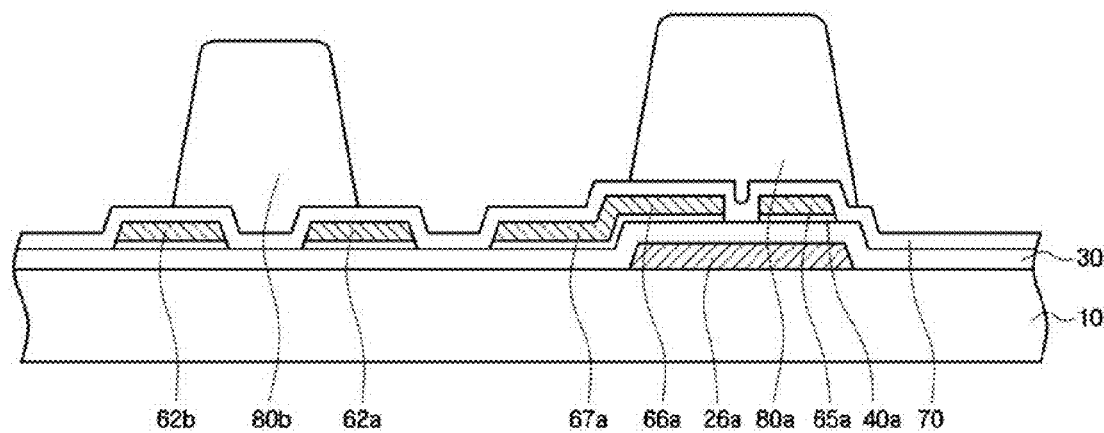

Thereafter, referring to FIGS. 1 and 6, a plurality of black matrix barrier ribs 80a and 80b may be formed along the boundaries of a pixel region. More specifically, the black matrix barrier ribs 80a and 80b may be formed by depositing an opaque material such as chromium and patterning the opaque material.

In the exemplary embodiment of FIGS. 4 to 10, a plasma treatment may be performed on the black matrix barrier ribs 80a and 80b. During the plasma treatment, a plasma treatment gas containing a hydrogen gas and a fluorine-based gas may be used. The fluorine-based gas may be $SF_6$ or $CF_4$. As a result of the plasma treatment, the black matrix barrier ribs 80a and 80b may contain fluorine. The black matrix barrier ribs 80a and 80b may contain about 0.01 to about 0.09 weight % of fluorine based on the total dry solid of the black matrix barrier ribs 80a and 80b to facilitate the formation of contact holes. In this case, a color organic material may not be uniformly spread over a pixel region, and thus, a color filter 90R, 90G or 90B may be thinner along the boundaries of a pixel region.

The formation of the black matrix barrier ribs 80a and 80b may involve forming a gate black matrix barrier rib 80a on the gate wiring (22 and 26) and forming a data black matrix barrier rib 80b on the first and second data lines 62a and 62b to intersect the gate black matrix barrier rib 80a.

Figure 12:
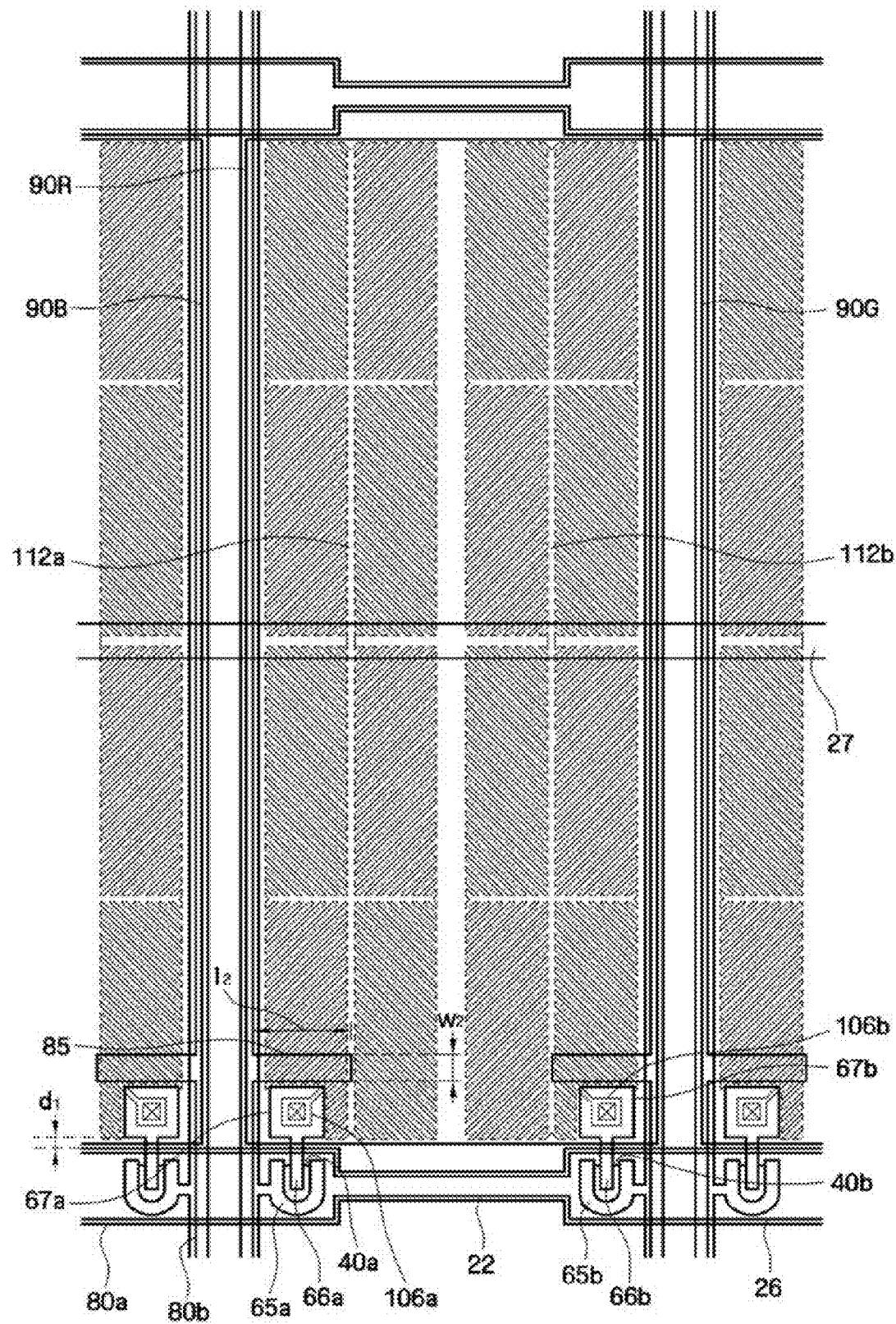
FIG. 12 illustrates a layout of a TFT substrate according to another exemplary embodiment of the present invention.
Figure 13:
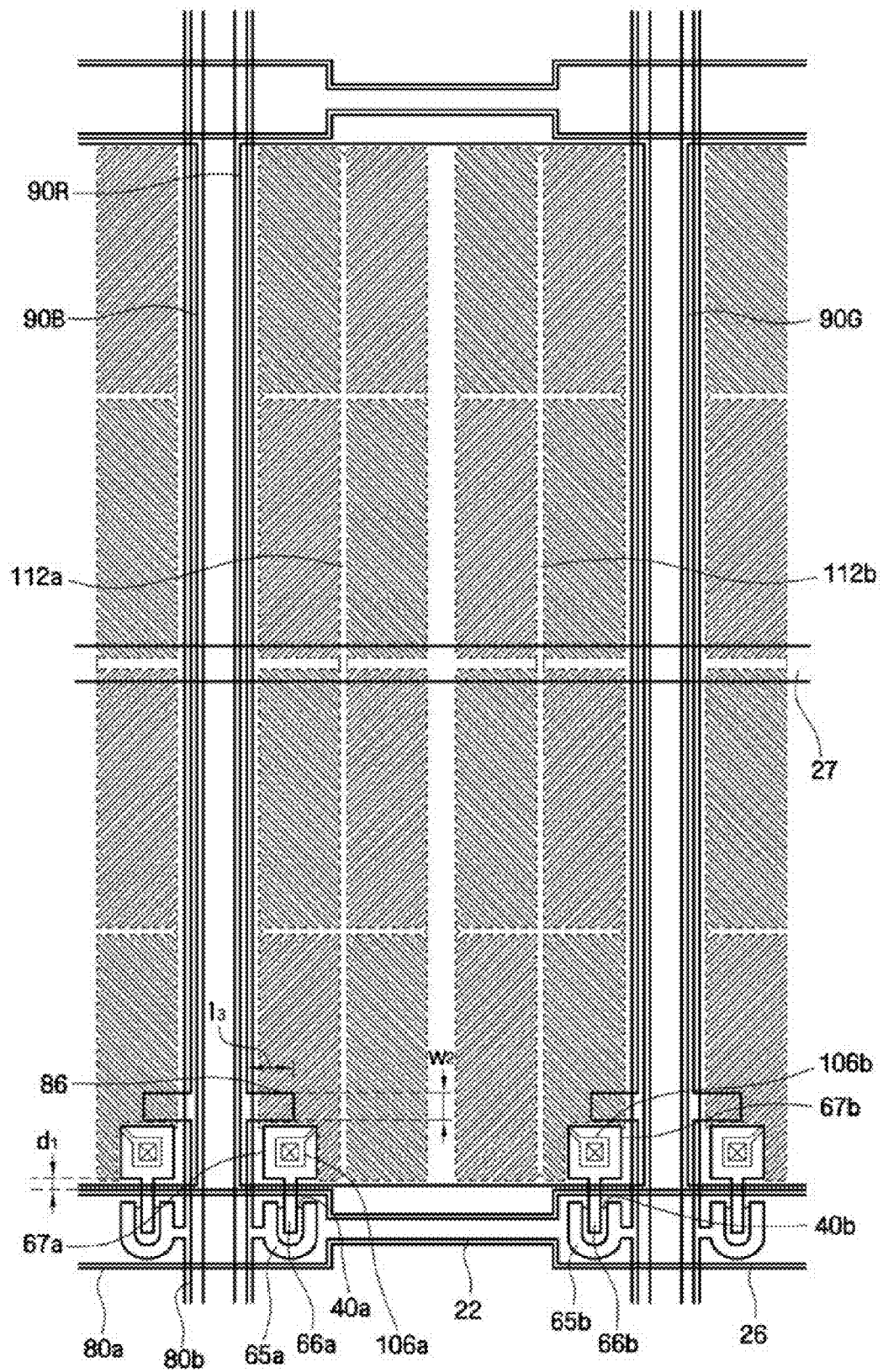
FIG. 13 illustrates a layout of a TFT substrate according to another exemplary embodiment of the present invention.
Figure 14:
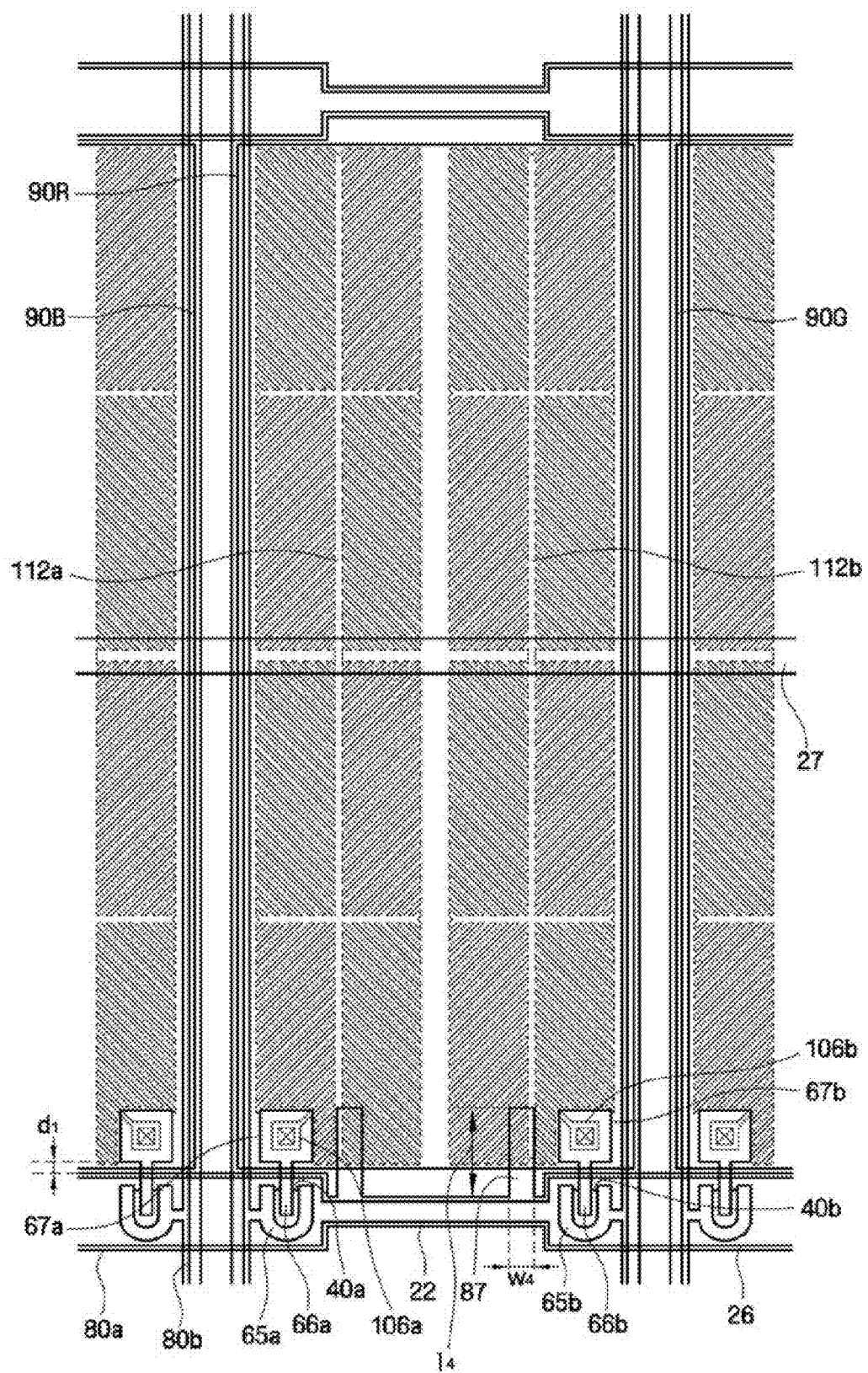
FIG. 14 illustrates a layout of a TFT substrate according to another exemplary embodiment of the present invention.

A black matrix barrier rib extension 85, 86, or 87 of FIG. 12, 13 or 14 may be formed during the formation of the black matrix barrier ribs 80a and 80b. A black matrix barrier structure including the black matrix barrier rib extension 85, 86, or 87 of FIG. 12, 13 or 14 can be directly applied to the exemplary embodiment of FIGS. 4 to 10.

Figure 7:
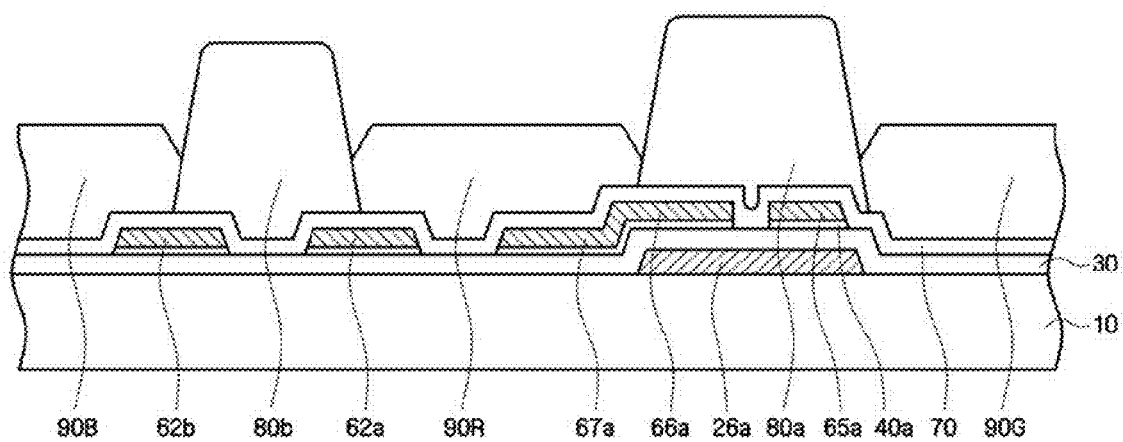

Thereafter, referring to FIGS. 1 and 7, a color filter 90R, 90G or 90B may be formed by spraying a color organic material using an inkjet printing method. In this case, the color organic material may be sprayed over the entire pixel region covered by the black matrix barrier ribs 80a and 80b. The color filter 90R, 90G or 90B may partially overlap the black matrix barrier ribs 80a and 80b.

The formation of the color filters 90R, 90G and 90B using the inkjet printing method will hereinafter be described in further detail. A color organic material, for example, a red organic material, may be sprayed over the pixel region covered by the black matrix barrier ribs 80a and 80b while moving an inkjet printing device (not shown) along a predetermined direction over the insulating substrate 10. In this manner, the red organic material may be sprayed over one in every three pixel regions. A green organic material or a blue organic material may be sprayed in the same manner as that used to spray the red organic material. If the inkjet printing device is capable of spraying three color organic materials, the three color organic materials may be alternately sprayed while moving the inkjet printing device over the insulating substrate 10.

Since the color organic material used to form the color filter 90R, 90G or 90B is a liquid material, the color filters 90R, 90G and 90B may be formed to have a step difference in a pixel region. That is, the color filters 90R, 90G and 90B may be thinner along the boundaries of a pixel region than in the middle of the pixel region. By using the inkjet printing method, it is possible to skip patterning and thus to reduce the time taken to form each of the color filters 90R, 90G and 90B by using the inkjet printing method.

Thereafter, the color organic materials filling each pixel region may be dried and cured by performing a thermal treatment or applying ultraviolet (UV) rays. As a result, the color filter 90R, 90G or 90B may be formed in each pixel region.

Figure 8:
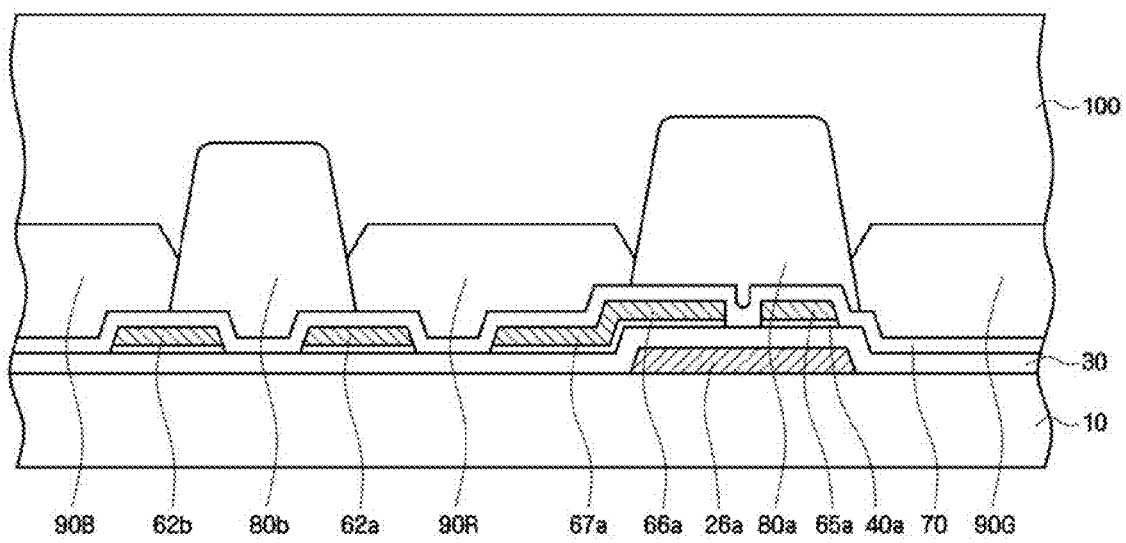

Thereafter, referring to FIGS. 1 and 8, a planarization layer 100 may be formed to cover the black matrix barrier ribs 80a and 80b and the color filters 90R, 90G and 90B. The planarization layer 100 may be formed of a photosensitive organic material.

Figure 9:
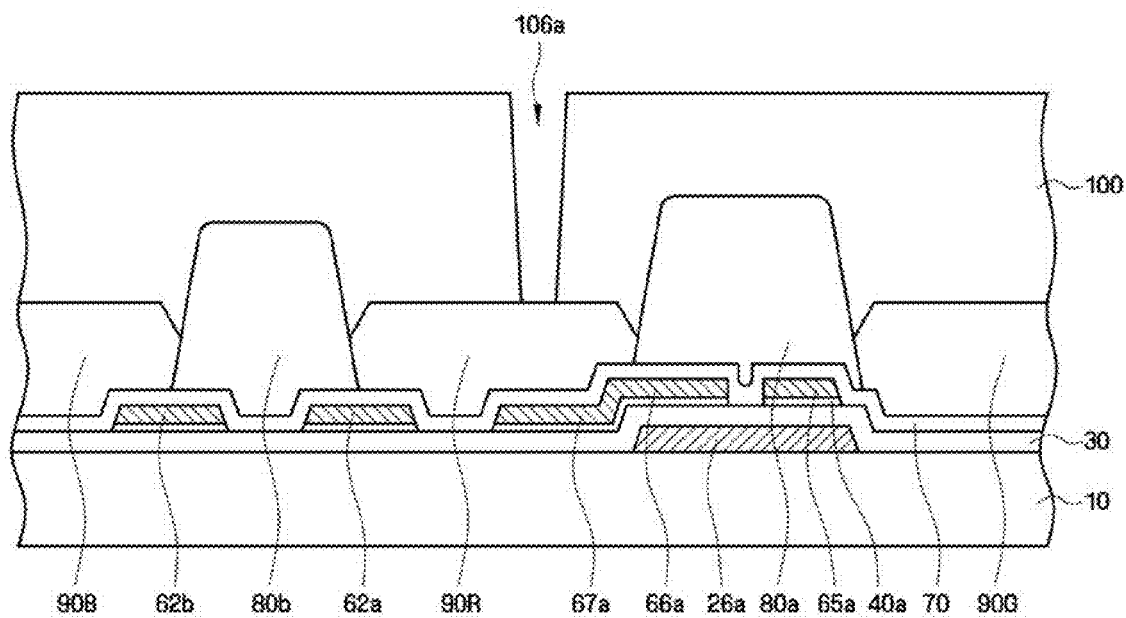

Thereafter, referring to FIG. 9, a plurality of contact holes 106a and 106b may be partially formed by patterning portions of the planarization layer 100 near the corners of a pixel region. The contact holes 106a and 106b may be about 3 to about 10 µm spaced apart from the black matrix barrier ribs 80a and 80b.

Figure 10:
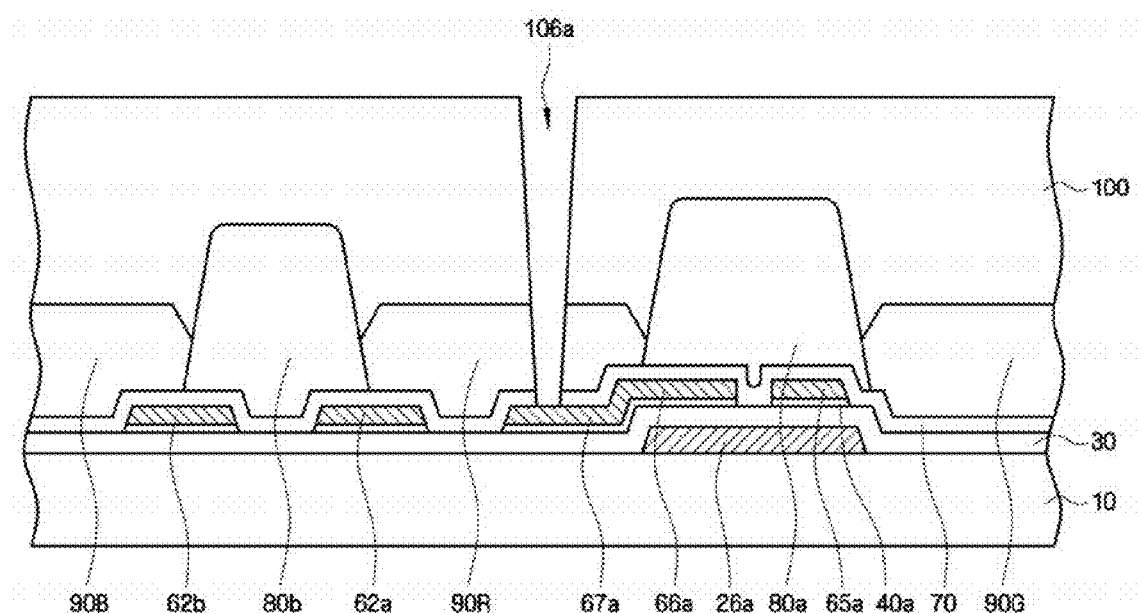

Thereafter, referring to FIG. 10, the formation of the contact holes 106a and 106b may be completed by performing dry etching on the color filter 90R, 90G or 90B and the passivation layer 70 using the planarization layer 100 as a mask. In this case, no residues may be left in the contact holes 106a and 106b because the color filter 90R, 90G or 90B is thinner along the boundaries of a pixel region.

In a variation of the exemplary embodiment of FIGS. 4-10, the planarization layer 100 may be formed of a non-photosensitive material, for example, a silicon-based material. The silicon-based material may be siloxane polymer. In this case, the contact holes 106a and 106b may be formed by performing dry etching on both the planarization layer 100 and the color filter 90R, 90G or 90B at the same time. Thus, the operation described above with reference to FIG. 9 may be omitted. If the planarization layer 100 is formed of a non-photosensitive material, the transmittance of a TFT substrate may increase.

Thereafter, referring to FIGS. 1 and 2, a transparent conductive material such as ITO or IZO or a reflective conductive material such as aluminum may be deposited on the color filter 90R, 90G or 90B and may then be patterned, thereby forming a pixel electrode (112a and 112b). The pixel electrode (112a and 112b) may be divided into first and second sub-pixel electrodes 112a and 112b. The first sub-pixel electrode 112a may be physically and electrically connected to a first drain electrode extension 67a through the contact hole 106a, and the second sub-pixel electrode 112b may be physically and electrically connected to a second drain electrode extension 67b through the contact hole 106b.

Thereafter, a spacer (not shown) may be formed on the insulating substrate 10, and particularly, on the gate wiring (22 and 26) or the data wiring (62a, 62b, 65a, 65b, 66a, 66b, 67a, and 67b).

A TFT substrate according to another exemplary embodiment of the present invention will hereinafter be described in detail with reference to FIG. 11.

Figure 11:
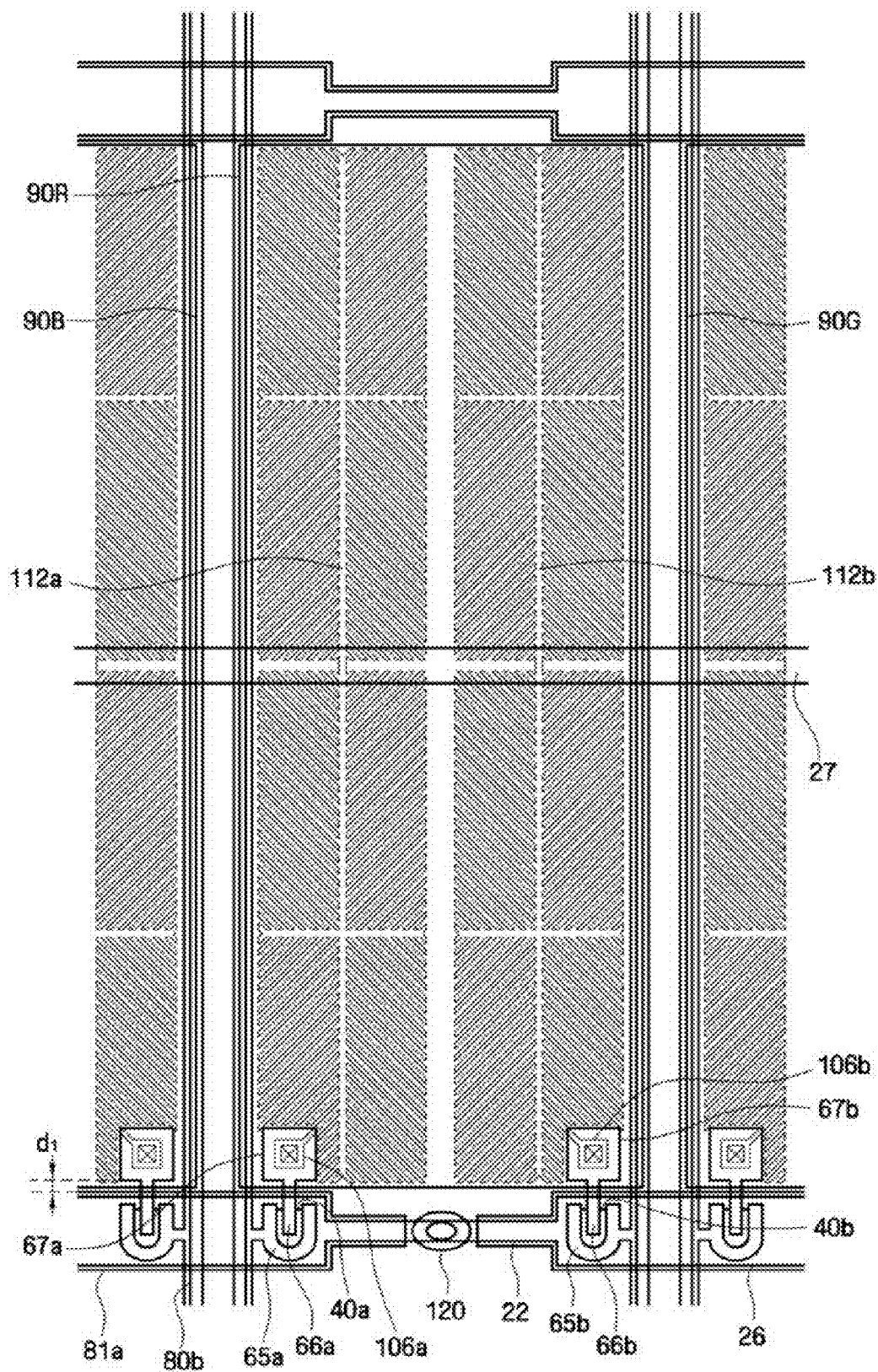
FIG. 11 illustrates a layout of a TFT substrate according to another exemplary embodiment of the present invention.

FIG. 11 illustrates a layout of a TFT substrate according to another exemplary embodiment of the present invention. Referring to FIG. 11, black matrix barrier ribs 81a and 80b are not formed in some regions. That is, a column spacer 120 may be formed on a gate wiring (22 and 26) or a data wiring (62a, 62b, 65a, 65b, 66a, 66b, 67a, and 67b), and neither a gate black matrix barrier rib 81a nor a data black matrix barrier rib 80b may be formed in an area in which the column spacer 120 is formed. In this case, the height of the column spacer 120 may be reduced by the height of black matrix barrier ribs 81a and 80b. Therefore, it is possible to reduce a cell gap.

A TFT substrate according to another exemplary embodiment of the present invention will hereinafter be described in detail with reference to FIG. 12.

FIG. 12 illustrates a layout of a TFT substrate according to another exemplary embodiment of the present invention. Referring to FIG. 12, in addition to a gate black matrix barrier rib 80a and a data black matrix barrier rib 80b, a black matrix barrier rib extension 85 may be formed. The gate black matrix barrier rib 80a may be formed on a gate wiring (22 and 26). The data black matrix barrier rib 80b may be formed on first and second data lines 62a and 62b and may intersect the gate black matrix barrier rib 80a. The black matrix barrier rib extension 85 may extend horizontally from the data black matrix barrier rib 80b and may be arranged substantially in parallel with the gate black matrix barrier rib 80a.

A plurality of contact holes 106a and 106b may be disposed in the space between the black matrix barrier rib extension 85 and the gate black matrix barrier rib 80a. The black matrix barrier rib extension 85, the gate black matrix barrier rib 80a and the data black matrix barrier rib 80b may surround all but one side of each of the contact holes 106a and 106b. Accordingly, a color organic material may be thinly deposited in areas in which the contact holes 106a and 106b are to be formed, and thus, a color filter 90R, 90G or 90B may be thinner. In this case, a length $l_2$ of the black matrix barrier rib extension 85 may be determined in consideration of the viscosity of a color organic material to fully cover one side of the contact hole 106a or 106b. That is, one side of the contact hole 106a or 106b may be isolated from a pixel region by the black matrix barrier rib extension 85. A width $w_2$ of the black matrix barrier rib extension 85 may be about 5 to about 10 μm. If the width $w_2$ is less than about 5 μm, it may be challenging to properly perform patterning for forming the black matrix barrier rib extension 85. On the other hand, if the width $w_2$ is greater than about 5 μm, the color filter 90R, 90G or 90B may not fully cover a pixel region, and thus, the aperture ratio may decrease.

A TFT substrate according to another exemplary embodiment of the present invention will hereinafter be described in detail with reference to FIG. 13.

FIG. 13 illustrates a layout of a TFT substrate according to another exemplary embodiment of the present invention. Referring to FIG. 13, a length $l_3$ of a black matrix barrier rib extension 86 may be determined in consideration of the viscosity of a color organic material to partially surround one side of a contact hole 106a or 106b. If the color organic material has high viscosity and the black matrix barrier rib extension 86 is too long, a color filter 90R, 90G or 90B may not fully cover a pixel region, and thus, light leakage may occur.

A TFT substrate according to another exemplary embodiment of the present invention will hereinafter be described in detail with reference to FIG. 14.

FIG. 14 illustrates a layout of a TFT substrate according to another exemplary embodiment of the present invention. Referring to FIG. 14, a black matrix barrier rib extension 87 may extend from a gate black matrix barrier rib 80a and may be arranged substantially in parallel with a data black matrix barrier rib 80b. A length $l_4$ of the black matrix barrier rib extension 87 may be determined in consideration of the viscosity of a color organic material to fully or partially surround one side of a contact hole 106a or 106b. In this exemplary embodiment, as in the exemplary embodiment of FIG. 12, a width $w_4$ of the black matrix barrier rib extension 87 may be about 5 to about 10 μm.

While embodiments of the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A thin-film transistor (TFT) substrate comprising:
a gate wiring formed on an insulating substrate;
a data wiring defining a pixel region by intersecting the gate wiring, the data wiring including a source electrode and a drain electrode;
a plurality of black matrix barrier ribs formed along the boundaries of the pixel region;
a color filter formed to cover the entire pixel region;
a pixel electrode formed on the color filter; and
a plurality of contact holes formed through the color filter near the corners of the pixel region through which the pixel electrode and the drain electrode contact each other,
wherein the black matrix barrier ribs contain about 0.01 weight % to about 0.09 weight % of fluorine based on the total dry solid of the black matrix barrier ribs.

2. The TFT substrate of claim 1, wherein a distance between the contact holes and the black matrix barrier ribs is about 3 μm to about 10 μm.

3. The TFT substrate of claim 1, wherein:
the black matrix barrier ribs include a gate black matrix barrier rib formed on the gate wiring, a data black matrix barrier rib formed on the data wiring and intersecting the gate black matrix barrier rib and a black matrix barrier rib extension; and
wherein the gate black matrix barrier rib, the data black matrix barrier rib and the black matrix barrier rib extension cover the contact holes.

4. The TFT substrate of claim 3, wherein the black matrix barrier rib extension either extends from the gate black matrix barrier rib and is arranged substantially in parallel with the data black matrix barrier rib
or extends from the data black matrix barrier rib and is arranged substantially in parallel with the gate black matrix barrier rib.

5. The TFT substrate of claim 3, wherein the black matrix barrier rib extension has a sufficient length to at least partially cover one side of each of the contact holes.

6. The TFT substrate of claim 3, wherein the black matrix barrier rib extension has a width of about 5 μm to about 10 μm.

7. A thin-film transistor (TFT) substrate comprising:
a gate wiring formed on an insulating substrate;
a data wiring defining a pixel region by intersecting the gate wiring, the data wiring including a source electrode and a drain electrode;
a plurality of black matrix barrier ribs formed along the boundaries of the pixel region;
a color filter formed to cover the entire pixel region;
a pixel electrode formed on the color filter;
a plurality of contact holes formed through the color filter near the corners of the pixel region through which the pixel electrode and the drain electrode contact each other; and
a column spacer formed on the gate wiring or the data wiring, wherein no black matrix barrier ribs are formed in an area in which the column spacer is formed.

8. A thin-film transistor (TFT) substrate comprising:
a gate wiring formed on an insulating substrate;
a data wiring defining a pixel region by intersecting the gate wiring, the data wiring including a source electrode and a drain electrode;
a plurality of black matrix barrier ribs formed along the boundaries of the pixel region;
a color filter formed to cover the entire pixel region;
a pixel electrode formed on the color filter;
a plurality of contact holes formed through the color filter near the corners of the pixel region through which the pixel electrode and the drain electrode contact each other; and
a planarization layer covering the black matrix barrier ribs and the color filter, wherein the contact holes are formed through both the planarization layer and the color filter.

9. The TFT substrate of claim 8, wherein the planarization layer is formed of a non-photosensitive silicon-based material.

10. The TFT substrate of claim 1, wherein:
the pixel electrode is divided into first and second sub-pixel electrodes; and
the data wiring includes a first data line transmitting a first data signal to the first sub-pixel electrode and a second data line transmitting a second data signal to the second sub-pixel electrode.

11. The TFT substrate of claim 10, wherein:
the contact holes include first and second contact holes formed through the color filter near the corners of the pixel region and facing each other;
the first data line is connected to the first sub-pixel electrode through the first contact hole; and the second data line is connected to the second sub-pixel electrode through the second contact hole.

12. The TFT substrate of claim 10, wherein each of the first and second sub-pixel electrodes includes a plurality of fine electrodes extending in a predetermined direction substantially in parallel with one another.

* * * * *